United States Patent
Zhang et al.

(10) Patent No.: US 7,101,720 B2
(45) Date of Patent: Sep. 5, 2006

(54) MIXED NOBLE METAL/NOBLE METAL OXIDE BOTTOM ELECTRODE FOR ENHANCED PGO C-AXIS NUCLEATION AND GROWTH

(75) Inventors: Fengyan Zhang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 394 days.

(21) Appl. No.: 10/801,375

(22) Filed: Mar. 15, 2004

(65) Prior Publication Data
US 2005/0199935 A1    Sep. 15, 2005

(51) Int. Cl.
*H01L 21/00* (2006.01)
(52) U.S. Cl. ......................... 438/3; 257/295
(58) Field of Classification Search .................... 438/3, 438/240, 253, 254, 255, 396; 257/295, 310
See application file for complete search history.

(56) References Cited

U.S. PATENT DOCUMENTS 6,586,260 B1 *  7/2003  Zhang et al. .................. 438/3
6,825,519 B1 * 11/2004  Li et al. ..................... 257/306
6,897,074 B1 *  5/2005  Zhang et al. .................. 438/3

* cited by examiner

*Primary Examiner*—Tuan H. Nguyen
(74) *Attorney, Agent, or Firm*—David C. Ripma

(57) ABSTRACT

A method is provided for forming a single-phase c-axis PGO film overlying a Pt metal electrode. Although the method is summarized in the context of a Pt bottom electrode, it has a broader application to other noble metals. The method comprises: forming a bottom electrode mixture of Pt and $Pt_3O_4$; forming a single-phase c-axis PGO thin film overlying the bottom electrode; and, forming a top electrode overlying the PGO thin film. Forming a bottom electrode mixture of a Pt and $Pt_3O_4$ includes: forming a Pt first layer; and, forming a second layer, interposed between the first layer and the PGO thin film, of fully oxidized $Pt_3O_4$. In other aspects, forming a bottom electrode mixture of Pt and $Pt_3O_4$ includes forming a polycrystalline mixture of Pt and $Pt_3O_4$. A c-axis PGO film capacitor is also provided. Again, a Pt bottom electrode is described, along with other noble metal bottom electrodes.

31 Claims, 4 Drawing Sheets

MIXED NOBLE METAL/NOBLE METAL OXIDE BOTTOM ELECTRODE FOR ENHANCED PGO C-AXIS NUCLEATION AND GROWTH

BACKGROUND OF THE INVENTION

1. Field of the Invention

This invention generally relates to integrated circuit (IC) fabrication and, more particularly, to a ferroelectric capacitor that uses a bottom electrode mixture of a noble metal and noble metal oxide to promote c-axis nucleation and growth of a PGO ferroelectric film.

2. Description of the Related Art $Pb_5Ge_3O_{11}$ (PGO) single-phase thin films exhibit ferroelectric properties when oriented along their c-axis. A c-axis oriented PGO film has desirable memory characteristics that make it suitable for use in one-transistor (1T) memory devices.

It has been found that PGO thins film grown on an Ir substrate exhibit stronger c-axis orientation than PGO grown on a Pt substrate, under equivalent deposition conditions. By comparing the XRD spectrum of Ir and Pt substrates (see FIGS. 1A and 1B), it can be seen that the Pt substrate shows a stronger preference for (111) peaks than Ir, at comparable film thicknesses. Since the crystal structure and lattice constant of Ir and Pt are about the same, 3.839 and 3.923 respectively, and the lattice constant of PGO is a=10.251 and c=10.685, the question arises as the whether the crystalline orientation may be a factor in promoting c-axis PGO nucleation and growth.

Although Ir bottom electrodes are known to enhance nucleation and the growth of c-axis PGO, Ir has one significant drawback. Ir is difficult to polish. Therefore, it can be a problem to use simple chemical-mechanical polish (CMP) processes, to form self-aligned gate structures in one-transistor integration, when using Ir as bottom electrode. Typically, an etching process must be used to define the Ir bottom electrode, which can induce etching damage at the gate and source/drain regions. Furthermore, a buffer polysilicon layer and a conductive barrier layer between the bottom electrode and polysilicon gate are usually needed in order to reduce the etching damage to the source drain region. These extra steps make the 1T integration process more complicated. However, Pt is easily polished.

It would be advantageous if Pt bottom electrodes could be used in 1T fabrication processes instead of Ir, to simplify the polishing processes.

It would be advantageous if Pt bottom electrodes could be formed that promote c-axis orientation in an overlying PGO ferroelectric thin film.

SUMMARY OF THE INVENTION

The present invention describes a polycrystalline Pt—PtOx bottom electrode underlying a PGO ferroelectric film deposition, for use in DRAM and FeRAM applications. The polycrystalline Pt—PtOx bottom electrode promotes a highly oriented c-axis PGO thin film, to simplify nonvolatile memory integration processes. This resultant structure can also be used in capacitors, pyroelectric infrared sensors, optical displays, optical switches, piezoelectric transducers, and surface acoustic wave devices.

Accordingly, a method is provided for forming a single-phase c-axis PGO film overlying a Pt metal electrode. Although the method is summarized in the context of a Pt bottom electrode, it has a broader application to other noble metals, are explained in the Detailed Description, below. The method comprising: forming a bottom electrode mixture of Pt and $Pt_3O_4$; forming a single-phase c-axis PGO thin film overlying the bottom electrode; and, forming a top electrode overlying the PGO thin film. Forming a bottom electrode mixture of a Pt and $Pt_3O_4$ includes: forming a Pt first layer; and, forming a second layer, interposed between the first layer and the PGO thin film, of fully oxidized $Pt_3O_4$. In other aspects, forming a bottom electrode mixture of Pt and $Pt_3O_4$ includes forming a polycrystalline mixture of Pt and $Pt_3O_4$.

A single-phase c-axis PGO film capacitor is also provided. Again, a Pt bottom electrode is summarized, but other noble metal bottom electrodes are described in the Detailed Description, below. The capacitor comprises a bottom electrode mixture of Pt and $Pt_3O_4$; a single-phase c-axis PGO thin film overlying the bottom electrode; and, a top electrode overlying the PGO thin film. The bottom electrode mixture may include: a Pt first layer; and, a second layer, interposed between the first layer and the PGO thin film, of fully oxidized $Pt_3O_4$. Alternately, the bottom electrode mixture of Pt and $Pt_3O_4$ may be understood to be a polycrystalline mixture of Pt and $Pt_3O_4$.

Additional details of the above-described PGO capacitors and PGO fabrication processes are provided below.

DETAILED DESCRIPTION OF THE PREFERRED EMBODIMENTS

Figure 2:
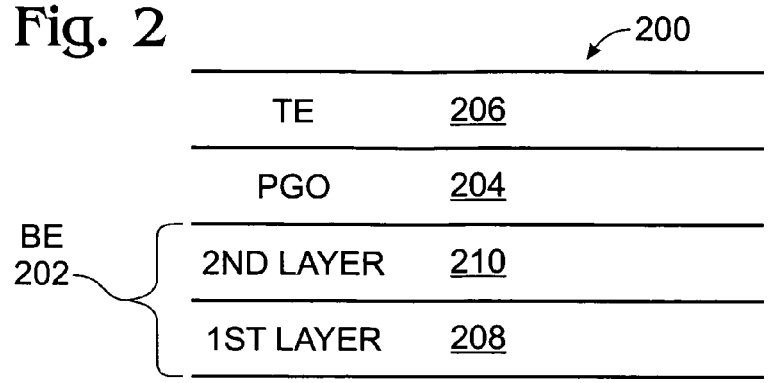
FIG. 2 is a partial cross-sectional view of the present invention $Pb_5Ge_3O_{11}$ (PGO) ferroelectric capacitor.

FIG. 2 is a partial cross-sectional view of the present invention $Pb_5Ge_3O_{11}$ (PGO) ferroelectric capacitor. The capacitor 200 comprises a bottom electrode 202 (BE) including a polycrystalline mixture of a first noble metal and an oxide of the first noble metal. A single-phase c-axis PGO ferroelectric thin film 204 overlies the bottom electrode 202. A top electrode 206 (TE) overlies the PGO ferroelectric thin film 204. In some aspects, the PGO ferroelectric thin film 204 is a pure c-axis PGO film.

The bottom electrode 202 may be a noble metal such as Pt, Ir, or Ru. When the polycrystalline mixture of the first noble metal and first noble metal oxide is either Pt or Ir, the bottom electrode 202 has a preference in the (111) orientation. That is, an XRD spectrum of such a bottom electrode would reveal a primarily (111) orientation, although traces of other orientations may also exist.

In some aspects, the bottom electrode 202 polycrystalline mixture includes a first layer 208 including a mixture of the first noble metal and first noble metal oxide. A second layer 210 of the first noble metal oxide is interposed between the first layer 208 and the ferroelectric thin film 204. Alternately, the first layer 208 may be a (pure) first noble metal first layer, and the second layer 210 may be a first noble metal oxide. That is, the second layer 210 is the metal oxide of the first noble metal. For example, if the bottom electrode is Pt, then the first layer 208 may be Pt, and the second layer 210 fully oxidized $Pt_3O_4$. In some aspects, the bottom electrode 202 has a sheet resistance of less than 5 ohms/square.

Figure 3:
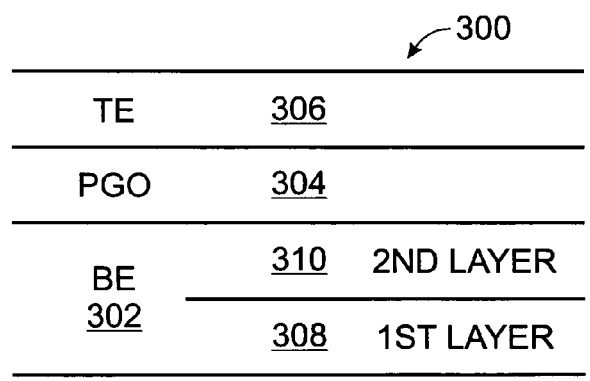
FIG. 3 is a partial cross-sectional view of the present invention single-phase c-axis PGO film capacitor, with a Pt bottom electrode.

FIG. 3 is a partial cross-sectional view of the present invention single-phase c-axis PGO film capacitor, with a Pt bottom electrode. The capacitor 300 comprises a bottom electrode 302 mixture of Pt and $Pt_3O_4$. A single-phase c-axis PGO thin film 304 overlies the bottom electrode 302. A top electrode 306 overlies the PGO thin film 304. In some aspects, the PGO ferroelectric thin film 304 is a pure c-axis PGO film. In other aspects, the bottom electrode 302 has a sheet resistance of less than 5 ohms/square.

More specifically, the bottom electrode 302 mixture of Pt and $Pt_3O_4$ includes a (pure) Pt first layer 308 and a second layer 310 of fully oxidized $Pt_3O_4$ interposed between the first layer 308 and the PGO thin film 304. Note, other aspects of the invention may use a second layer 310 of non-fully oxidized Pt, or a mixture of Pt with a Pt oxide. Alternately, the bottom electrode 302 mixture of Pt and $Pt_3O_4$ may be understood to a polycrystalline mixture of Pt and $Pt_3O_4$.

Functional Description

One assumption supporting the present invention is that polycrystalline bottom electrode structures promote the c-axis orientation of an overlying PGO thin film. Conventionally, Ir is closer to a polycrystalline structure than Pt, which is typically an epitaxial or single-crystal structure. Further, from Auger Electron Spectroscopy (AES) data, a thin layer of $IrO_2$ can be assumed to form over a Ir bottom electrode during conventional PGO deposition and annealing processes. Using conventional processes, it is difficult to form Pt oxide over a Pt substrate when annealed in an $O_2$ ambient environment.

Figure 1A:
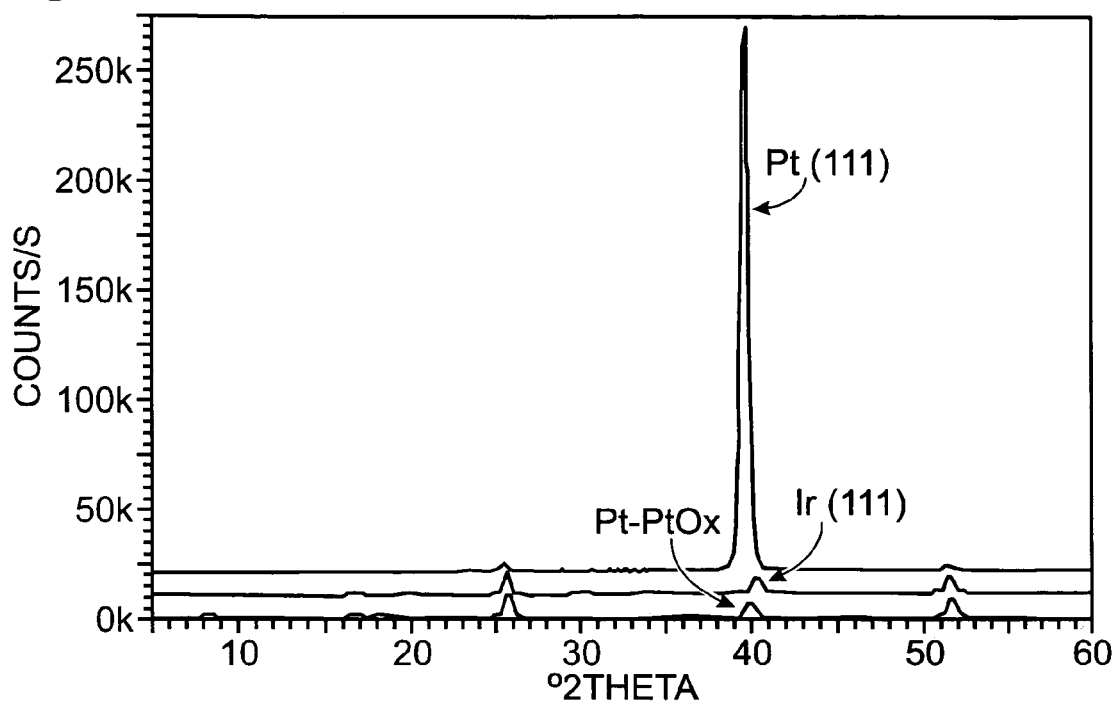
FIGS. 1A and 1B are drawings depicting the x-ray diffraction (XRD) of PGO grown on Ir, Pt, and Pt—PtOx substrates.
Figure 1B:
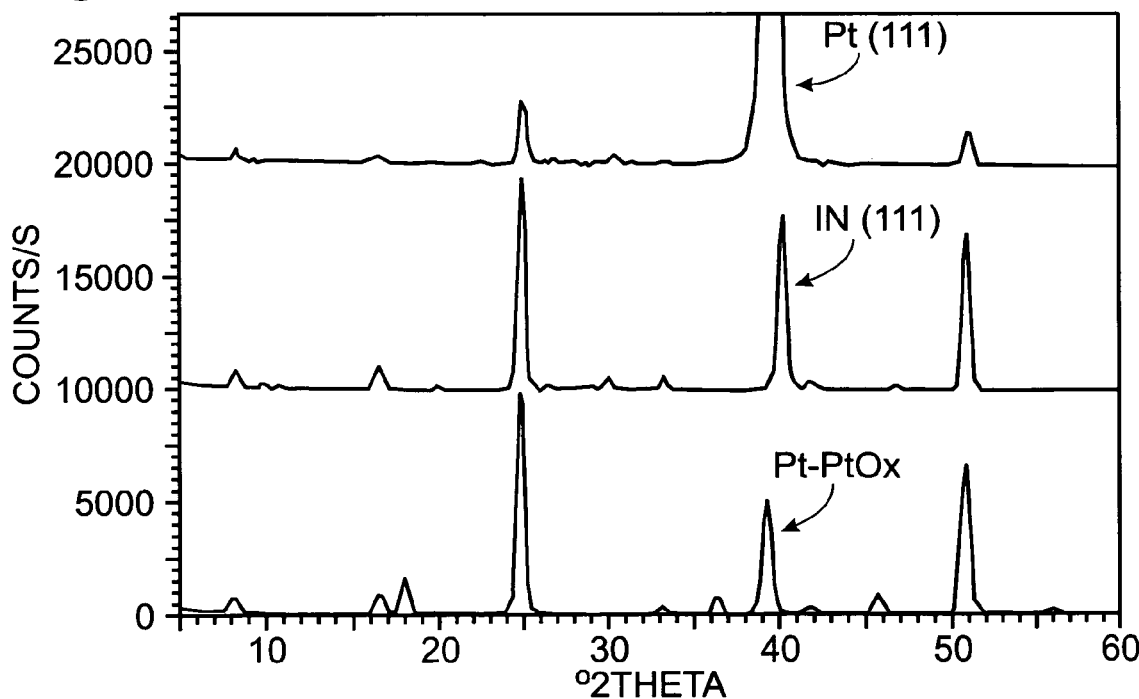

FIGS. 1A and 1B are drawings depicting the x-ray diffraction (XRD) of PGO grown on Ir, Pt, and Pt—PtOx substrates. FIG. 1B is the same spectrum as FIG. 1A, scaled differently, so that Ir, Pt, and Pt—PtOx (mixture of Pt and Pt oxide) can be compared.

Figure 4:
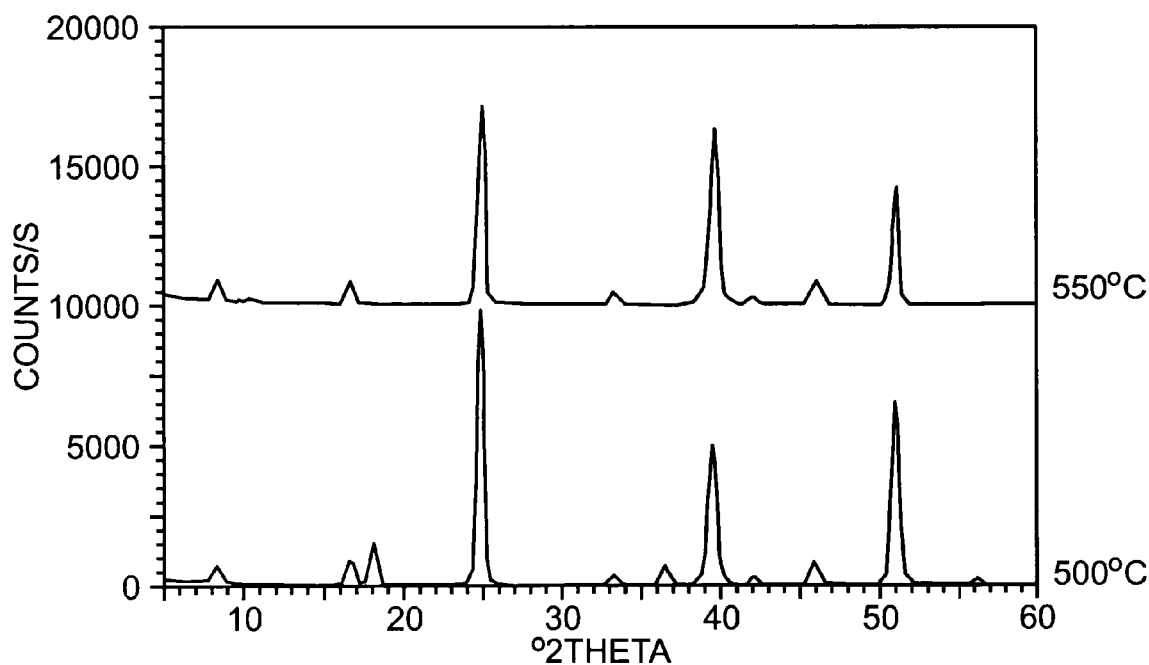
FIG. 4 is a drawing of an XRD spectrum of PGO, deposited on a mixture of Pt and an oxide of Pt, at different annealing conditions.

FIG. 4 is a drawing of an XRD spectrum of PGO, deposited on a mixture of Pt and an oxide of Pt, at different annealing conditions.

Figure 5:
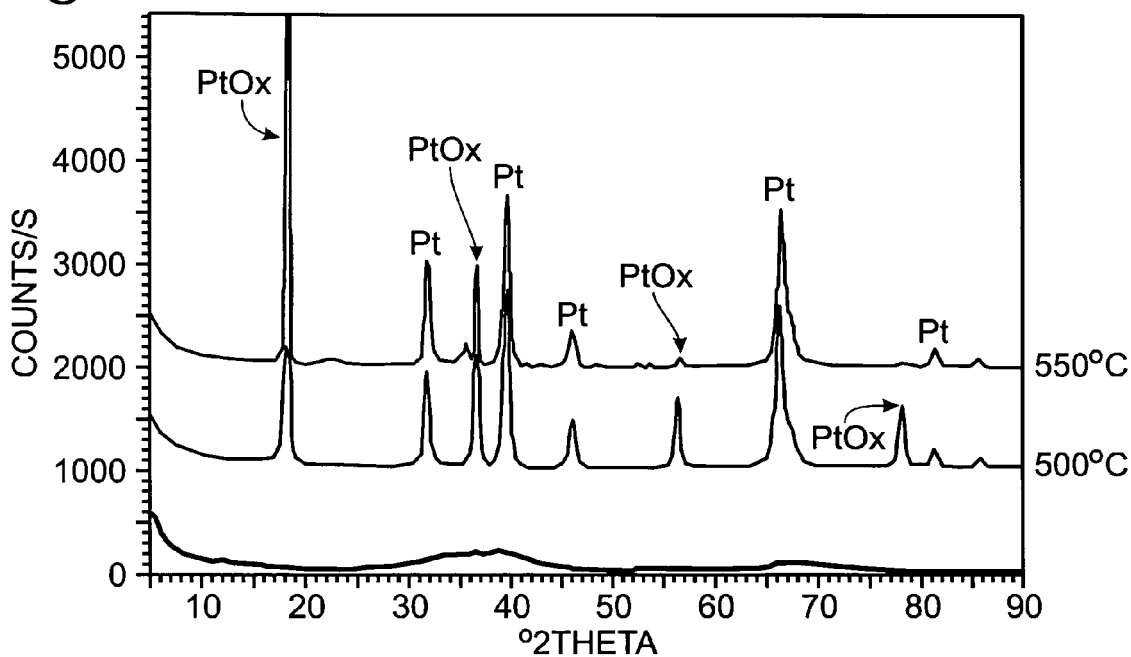
FIG. 5 is a drawing of an XRD spectrum of Pt—PtOx at different annealing conditions.

FIG. 5 is a drawing of an XRD spectrum of Pt—PtOx at different annealing conditions.

Since pure Pt is difficult to oxidize when annealed in oxygen ambient, conventionally it has been relatively difficult to grow highly oriented single-phase c-axis PGO on pure Pt, which is typically in a strong (111) orientation. In order to modify the surface condition, the present invention Pt is sputter deposited in atmosphere mixture of Ar and $O_2$, instead of pure Ar.

Comparing the XRD spectrums of FIGS. 1A and 5, it can be seen that the intensity of (111) peaks of a Pt electrode are significantly reduced using the present invention process. As seen in FIG. 5, $Pt_3O_4$ peaks are detected, indicating that crystal structure of the electrode is modified to a polycrystalline Pt and PtOx mixture.

PGO thin film is deposited on this Pt—PtOx bottom electrode. FIG. 1B is the XRD spectrum of PGO grown on Pt—PtOx, Pt, and Ir, showing that the c-axis peaks of PGO on Pt—PtOx or Ir are about the same, and that these peaks are much stronger than those associated with the (pure) Pt substrate.

Since Pt—PtOx can be easily CMP polished, the use of such a material as a bottom electrode simplifies integration processes and reduces the etching damage at the gate and source drain region in FeRAM and DRAM devices, especially in single-transistor applications.

The following is an example of a process to deposit Pt—PtOx as a bottom electrode. The Pt—PtOx bottom electrode is deposited by reactive sputtering a pure Pt target in Ar and $O_2$ mixture ambient. The base pressure is about $7\times10^{-7}$ Torr. The power on the Pt target is 50 watts (W) to 500 W, for a 4" diameter target. The partial pressure of Ar and $O_2$ are 1–5 milliTorr (mTorr) and 1–5 mTorr, respectively.

After the Pt—PtOx deposition, an oxygen ambient annealing is performed. Specifically, a rapid thermal anneal (RTA) is performed at 400–800° C., for a duration of 1 minute to 1 hour.

Referencing FIG. 5, the XRD spectra of Pt—PtOx after different annealing conditions, it can be seen that the as-deposited Pt—PtOx is much more amorphous. After being annealed at 500° C. for 15 minutes, peaks of polycrystalline $Pt_3O_4$ are detected. $Pt_3O_4$ has a lattice constant of a=5.585. After being annealed at 550° C. for 15 minutes, peaks of the $Pt_3O_4$ phase weaken, as the Pt peaks remain about the same.

Figure 6:
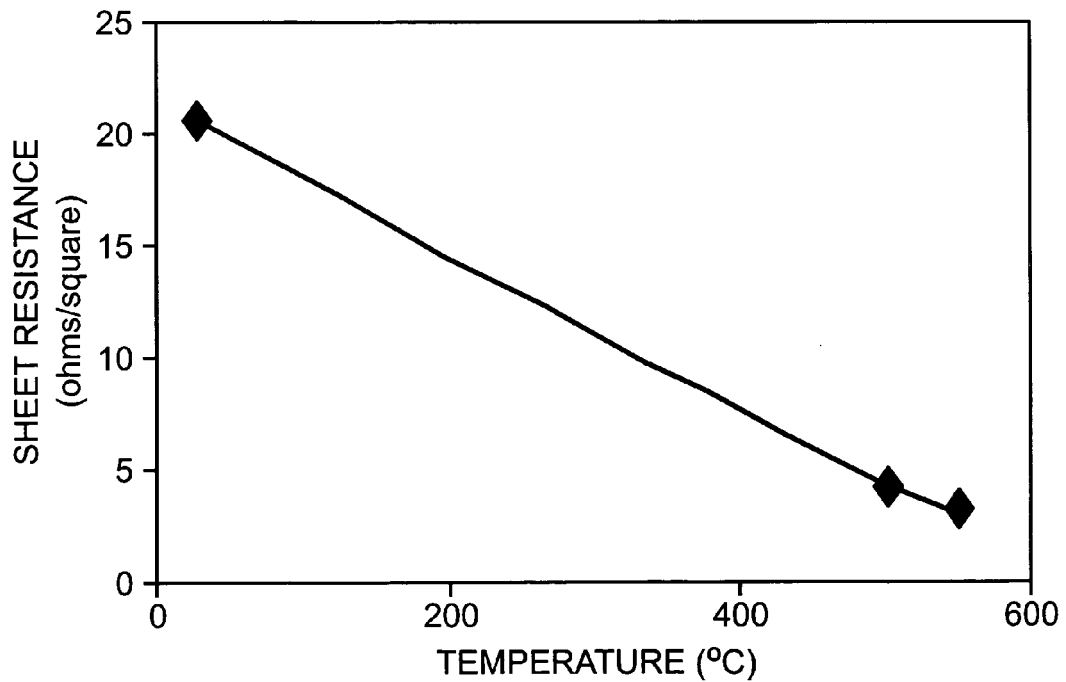
FIG. 6 is a drawing depicting the sheet resistance of as-deposited Pt—PtOx annealed at 500° C. and 550° C. for 15 minutes.

FIG. 6 is a drawing depicting the sheet resistance of as-deposited Pt—PtOx annealed at 500° C. and 550° C. for 15 minutes. Although PtOx conventionally exhibits large resistivity, the grain growth of Pt appears to lower the resistivity of Pt—PtOx mixture electrode.

The PGO thin film can be spin-coated using lead acetate and germanium isopropoxide in a 2-(2-ethoxyethoxy) ethanol solution, heated with air exposure to form a deep red-brown color. The baking temperature is around 50–350° C., for 30 seconds to 3600 seconds. The annealing temperature after each spin-on layer is around 400–550° C., for 30 seconds to 3600 seconds. The final annealing temperature is around 450–600° C., for 5 minutes to 3 hours. Note, the present invention is not limited to any particular PGO deposition process. Other PGO depositions, besides the one mentioned above, are known in the art.

Figure 7:
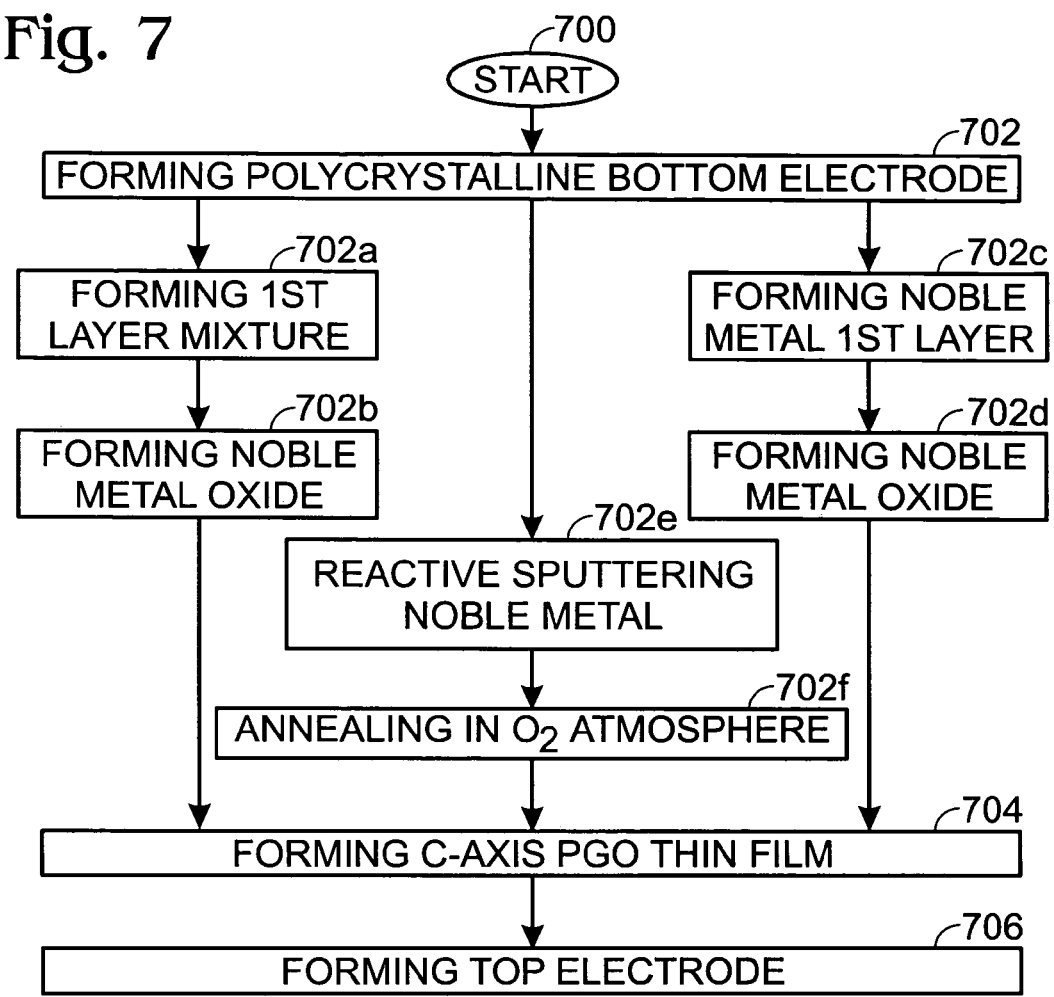
FIG. 7 is a flowchart illustrating the present invention method for forming a single-phase c-axis $Pb_5Ge_3O_{11}$ (PGO) ferroelectric film overlying a noble metal electrode.

FIG. 7 is a flowchart illustrating the present invention method for forming a single-phase c-axis $Pb_5Ge_3O_{11}$ (PGO) ferroelectric film overlying a noble metal electrode. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 forms a bottom electrode polycrystalline mixture of a first noble metal and an oxide of the first noble metal. In some aspects, the bottom electrode mixture has a sheet resistance of less than 5 ohms/square. Step 704 forms a single-phase c-axis PGO ferroelectric thin film overlying the bottom electrode. In one aspect, Step 704 forms a pure c-axis PGO thin film. Step 706 forms a top electrode overlying the PGO ferroelectric thin film.

In some aspects of the method, forming a bottom electrode polycrystalline mixture of a first noble metal and an oxide of the first noble metal in Step 702 includes using a noble metal such as Pt, Ir, or Ru. When the noble metal is either Pt or Ir, Step 702 may include forming a polycrystalline mixture having a preference in the (111) orientation.

In one aspect, forming a bottom electrode polycrystalline mixture of the first noble metal and first noble metal oxide includes substeps. Step 702a forms a first layer including a mixture of the first noble metal and first noble metal oxide. Step 702b forms a second layer, interposed between the first layer and the ferroelectric thin film, of the first noble metal oxide.

In another aspect, Step 702c forms a first noble metal first layer. Step 702d forms a second layer, interposed between the first layer and the ferroelectric thin film, of the first noble metal oxide. For example, Step 702c may form a Pt first layer. Step 702d forms a second layer, interposed between the first layer and the ferroelectric thin film, of fully oxidized $Pt_3O_4$.

In a different aspect, Step 702e reactive sputters the first noble metal in an atmosphere including Ar and O2. Step 702f anneals the mixture in an O2 atmosphere. For example, Step 702e may reactive sputter in an atmosphere including Ar and O2 includes, with respect to a base pressure of $7 \times 10^{-7}$ Torr. Further, Step 702e may use an Ar partial pressure in the range of 1 to 5 mTorr and an O2 partial pressure in the range of 1 to 5 mTorr. A sputtering power in the range of 50 to 500 watts may be used in Step 702e, with respect to a 4-inch diameter target.

Annealing the mixture in an O2 atmosphere (Step 702f) may include rapid thermal annealing (RTA) at a temperature in the range of 400 to 800 degrees C., for a duration in the range of 1 to 60 minutes.

Figure 8:
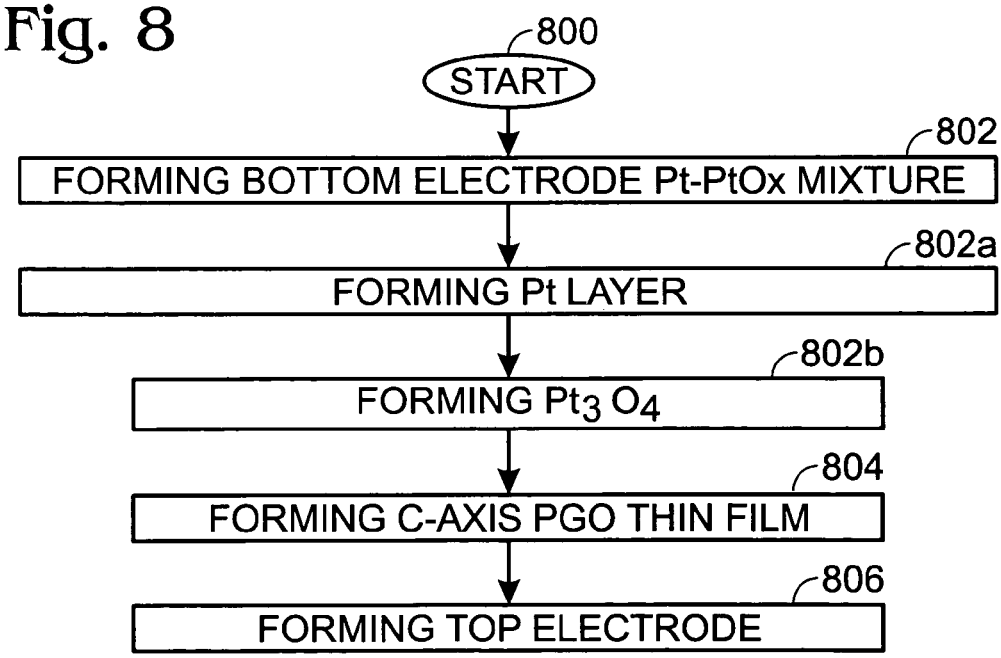
FIG. 8 is a flowchart illustrating the present invention method for forming a single-phase c-axis PGO film overlying a Pt metal electrode.

FIG. 8 is a flowchart illustrating the present invention method for forming a single-phase c-axis PGO film overlying a Pt metal electrode. The method starts at Step 800. Step 802 forms a bottom electrode mixture of Pt and $Pt_3O_4$. Step 804 forms a single-phase c-axis PGO thin film overlying the bottom electrode. Step 806 forms a top electrode overlying the PGO thin film.

In some aspects, forming a bottom electrode mixture of a Pt and $Pt_3O_4$ includes substeps. Step 802a forms a Pt first layer. Step 802b forms a second layer, interposed between the first layer and the PGO thin film, of fully oxidized $Pt_3O_4$.

In another aspect, forming a bottom electrode mixture of Pt and $Pt_3O_4$ in Step 802 includes forming a polycrystalline mixture of Pt and $Pt_3O_4$. In a different aspect, Step 802 forms a bottom electrode mixture having a sheet resistance of less than 5 ohms/square.

PGO ferroelectric capacitors formed of noble metal/noble metal oxide mixtures, and related fabrication processes have been presented. Specific processes have been presented to illustrate the invention using Pt as an example. However, the invention is not limited to merely these examples. Ru and Ir have been suggested as other bottom electrode materials, but the invention may have application to an even broader range of noble metals. Further, the present invention process may also have application to other ferroelectric materials besides PGO. Although the presented processes are limited to the fabrication of capacitors, those skilled in the art can appreciate that the invention has application to devices such as 1T memories, and other devices that may use ferroelectric capacitors. These other devices may include pyroelectric infrared sensors, optical displays, optical switches, piezoelectric transducers, and surface acoustic wave devices. Other variations and embodiments of the invention will occur to those skilled in the art.

We claim:

1. A method for forming a single-phase c-axis $Pb_5Ge_3O_{11}$ (PGO) ferroelectric film overlying a noble metal electrode, the method comprising:

forming a bottom electrode polycrystalline mixture of a first noble metal and an oxide of the first noble metal; and, forming a single-phase c-axis PGO ferroelectric thin film overlying the bottom electrode.

2. The method of claim 1 wherein forming a bottom electrode polycrystalline mixture of a first noble metal and an oxide of the first noble metal includes using a noble metal selected from the group including Pt, Ir, and Ru.

3. The method of claim 1 wherein forming a bottom electrode polycrystalline mixture of the first noble metal and first noble metal oxide includes forming a polycrystalline mixture, using a noble metal selected from the group including Pt and Ir, having a preference in the (111) orientation.

4. The method of claim 1 wherein forming a bottom electrode polycrystalline mixture of the first noble metal and first noble metal oxide includes:

forming a first layer including a mixture of the first noble metal and first noble metal oxide; and, forming a second layer, interposed between the first layer and the ferroelectric thin film, of the first noble metal oxide.

5. The method of claim 1 wherein forming a bottom electrode polycrystalline mixture of the first noble metal and first noble metal oxide includes:

forming a first noble metal first layer; and, forming a second layer, interposed between the first layer and the ferroelectric thin film, of the first noble metal oxide.

6. The method of claim 1 wherein forming a bottom electrode polycrystalline mixture of the first noble metal and first noble metal oxide includes:

forming a Pt first layer; and, forming a second layer, interposed between the first layer and the ferroelectric thin film, of fully oxidized $Pt_3O_4$.

7. The method of claim 1 wherein forming a single-phase c-axis PGO ferroelectric thin film overlying the bottom electrode includes forming a pure c-axis PGO thin film.

8. The method of claim 1 wherein forming a bottom electrode polycrystalline mixture of the first noble metal and first noble metal oxide includes:

reactive sputtering the first noble metal in an atmosphere including Ar and O2; and, annealing the mixture in an O2 atmosphere.

9. The method of claim 8 wherein reactive sputtering the first noble metal in an atmosphere including Ar and O2 includes, with respect to a base pressure of $7 \times 10^{-7}$ Torr:

using a Ar partial pressure in the range of 1 to 5 milliTorr (mTorr); and, using an O2 partial pressure in the range of 1 to 5 mTorr.

10. The method of claim 8 wherein reactive sputtering the first noble metal in an atmosphere including Ar and O2 includes, with respect to a 4 inch diameter target, using a sputtering power in the range of 50 to 500 watts.

11. The method of claim 8 wherein annealing the mixture in an O2 atmosphere includes rapid thermal annealing (RTA) at a temperature in the range of 400 to 800 degrees C., for a duration in the range of 1 to 60 minutes.

12. The method of claim 1 further comprising:

forming a top electrode overlying the PGO ferroelectric thin film.

13. The method of claim 1 wherein forming a bottom electrode polycrystalline mixture of a first noble metal and an oxide of the first noble metal includes forming a bottom electrode mixture having a sheet resistance of less than 5 ohms/square.

14. A method for forming a single-phase c-axis $Pb_5Ge_3O_{11}$ (PGO) film overlying a Pt metal electrode, the method comprising:
   forming a bottom electrode mixture of Pt and $Pt_3O_4$; and,
   forming a single-phase c-axis PGO thin film overlying the bottom electrode.

15. The method of claim 14 wherein forming a bottom electrode mixture of a Pt and $Pt_3O_4$ includes:
   forming a Pt first layer; and,
   forming a second layer, interposed between the first layer and the PGO thin film, of fully oxidized $Pt_3O_4$.

16. The method of claim 14 further comprising:
   forming a top electrode overlying the PGO thin film.

17. The method of claim 14 wherein forming a bottom electrode mixture of Pt and $Pt_3O_4$ includes forming a polycrystalline mixture of Pt and $Pt_3O_4$.

18. The method of claim 14 wherein forming a bottom electrode mixture of Pt and $Pt_3O_4$ includes forming a bottom electrode mixture having a sheet resistance of less than 5 ohms/square.

19. A $Pb_5Ge_3O_{11}$ (PGO) ferroelectric capacitor comprising:
   a bottom electrode including a polycrystalline mixture of a first noble metal and an oxide of the first noble metal;
   a single-phase c-axis PGO ferroelectric thin film overlying the bottom electrode; and,
   a top electrode overlying the PGO ferroelectric thin film.

20. The capacitor of claim 19 wherein the bottom electrode includes a noble metal selected from the group including Pt, Ir, and Ru.

21. The capacitor of claim 19 wherein the polycrystalline mixture of the first noble metal and first noble metal oxide is a noble metal selected from the group including Pt and Ir, having a preference in the (111) orientation.

22. The capacitor of claim 19 wherein the bottom electrode polycrystalline mixture of the first noble metal and first noble metal oxide includes:
   a first layer including a mixture of the first noble metal and first noble metal oxide; and,
   a second layer, interposed between the first layer and the ferroelectric thin film, of the first noble metal oxide.

23. The capacitor of claim 19 wherein the bottom electrode polycrystalline mixture of the first noble metal and first noble metal oxide includes:
   a first noble metal first layer; and,
   a second layer, interposed between the first layer and the ferroelectric thin film, of the first noble metal oxide.

24. The capacitor of claim 19 wherein the bottom electrode polycrystalline mixture of the first noble metal and first noble metal oxide includes:
   a Pt first layer; and,
   a second layer, interposed between the first layer and the ferroelectric thin film, of fully oxidized $Pt_3O_4$.

25. The capacitor of claim 19 wherein the PGO ferroelectric thin film is a pure c-axis PGO film.

26. The capacitor of claim 19 wherein the bottom electrode has a sheet resistance of less than 5 ohms/square.

27. A single-phase c-axis $Pb_5Ge_3O_{11}$ (PGO) film capacitor comprising:
   a bottom electrode mixture of Pt and $Pt_3O_4$;
   a single-phase c-axis PGO thin film overlying the bottom electrode; and,
   a top electrode overlying the PGO thin film.

28. The capacitor of claim 27 wherein the bottom electrode mixture of Pt and $Pt_3O_4$ includes:
   a Pt first layer; and,
   a second layer, interposed between the first layer and the PGO thin film, of fully oxidized $Pt_3O_4$.

29. The capacitor of claim 27 wherein the bottom electrode mixture of Pt and $Pt_3O_4$ is a polycrystalline mixture of Pt and $Pt_3O_4$.

30. The capacitor of claim 27 wherein the PGO ferroelectric thin film is a pure c-axis PGO film.

31. The capacitor of claim 27 wherein the bottom electrode has a sheet resistance of less than 5 ohms/square.

* * * * *